United States Patent

Mikhael et al.

[11] Patent Number: 6,040,017
[45] Date of Patent: Mar. 21, 2000

[54] FORMATION OF MULTILAYERED PHOTONIC POLYMER COMPOSITES

[75] Inventors: Michael G. Mikhael; Ali Boufelfel; Angelo Yializis, all of Tucson, Ariz.

[73] Assignee: Sigma Laboratories, Inc., Tucson, Ariz.

[21] Appl. No.: 09/165,999

[22] Filed: Oct. 2, 1998

[51] Int. Cl.[7] .................................................. C23C 16/48
[52] U.S. Cl. .................. 427/496; 427/497; 427/508; 427/509; 427/255.6; 427/255.7
[58] Field of Search ................... 427/496, 497, 427/508, 509, 255.6, 255.7

[56] References Cited

U.S. PATENT DOCUMENTS

| 4,954,371 | 9/1990 | Yializis | 427/497 |
| 5,681,615 | 10/1997 | Affinito et al. | 427/255.6 |
| 5,902,641 | 5/1999 | Affinito et al. | 427/255.32 |

OTHER PUBLICATIONS

Wang, "Photoconductivity of Fullerene–Doped Polymers", *Nature*, 356, 585 (1992); No Month).

Burzynski et al, "Novel Optical Composites: Second–order Nonlinear Optical and Polymeric Photorefractive Materials for optical Information Storage and Processing Applications", *Optical Engineering*, 35(2), 43 (1996); (No Month).

Mudigonda et al, "Polymer Blends and Copolymers Based on N–Vinylcarbazole and N–Phenyl–2–(2'thienyl)–5–(5"–vinyl–2"–thienyl)pyrrole: A Novel Approach to Tailor Electrochromic Properties", *ACS Polymer Preprints*, 39(1), 139 (1998); (No Month).

*Primary Examiner*—Timothy Meeks

[57] ABSTRACT

The fabrication of linear and non-linear optical materials including photoconductive, photorefractive, and optical limiting polymer composite films from radiation curable homogeneous solutions or heterogeneous slurries via vacuum flash evaporation techniques is disclosed.

6 Claims, 1 Drawing Sheet

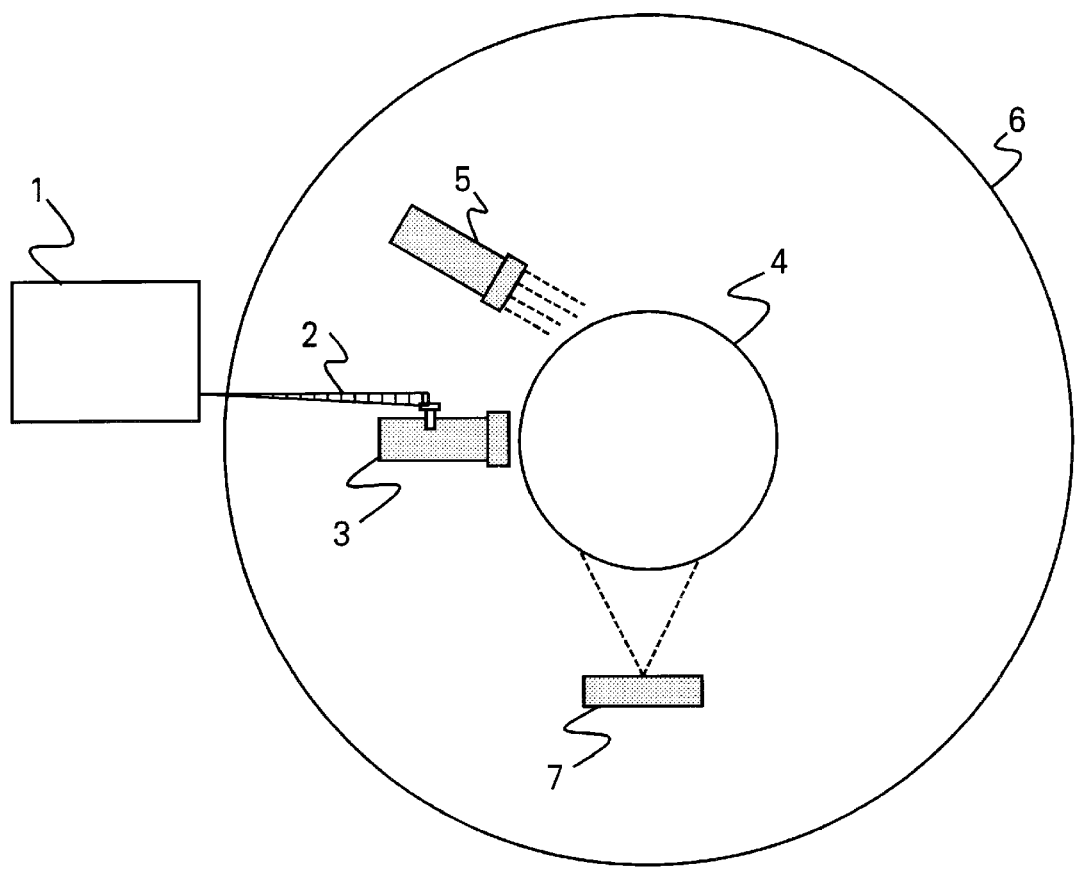

6,040,017

FORMATION OF MULTILAYERED PHOTONIC POLYMER COMPOSITES

TECHNICAL FIELD

The present invention relates generally to producing photonic polymer composite films via vacuum deposition and radiation curing techniques. More specifically, the present invention relates to mixing an electron acceptor dopant, an electron donor organic substance, and a radiation-curable monomer formulation into a homogeneous solution or a heterogeneous slurry. Either the homogeneous solution or the heterogeneous mixture is evaporated in vacuum and deposited on a substrate as a liquid film which is cured immediately afterwards by a radiation source to result into a polymer composite coating. The choice of constituents in the mixture dictates the optical properties of the polymer composites. A wide variety of optical materials can thus be obtained by careful control of the stochiometry of the mixture.

BACKGROUND ART

Polymer composites form a new class of very useful materials that are used increasingly in various devices for a wide range of applications in the field of photonics (photoconductivity, photolimitation, linear and non-linear optical materials), electronics (capacitors), and various sensing devices. As reported in the literature, polymers that are doped often exhibit a substantial improvement in performance over that of the matrix.

Techniques for large scale fabricating polymer composites include flash evaporation, extrusion, and monomer spreading and curing. The curing of the monomer formulation is done either by thermal means or by radiation. In radiation curing, it is desirable for the monomers or monomer mixtures to have an average of at least two double bonds. This reactivity assures a high speed cross-linking when exposed to the radiation source. For flash evaporation, formulations containing electron acceptor dopants and electron donor substances are evaporated at temperatures above their boiling point and well below the decomposition point and thus are not degraded by the deposition process.

Vacuum flash evaporation of a monomer formulation, as described in U.S. Pat. Nos. 4,954,371, and 5,681,615, is done by introducing a misted liquid formulation into an evaporator which is heated at a temperature above the boiling points of the components and below the temperature which causes the degradation and/or polymerization of the monomers. Upon contact with the evaporator wall, the liquid droplets are flash-evaporated. The vapor, upon contact with a cooled substrate surface, condenses into a thin liquid layer that is subsequently radiation-cured, to form a thin homogeneous polymer composite film.

The existing commonly used methods for fabricating organic polymer photonic films are solvent based relatively slow coating techniques; see, e.g., Y. Wang, "Photoconductivity of Fullerene-Doped Polymers", *Nature,* 356–585 (1992); R. Burzynski et al, "Novel Optical Composites: Second-order Nonlinear Optical and Polymeric Photorefractive Materials for optical Information Storage and Processing Applications", *Optical Engineering,* 35(2), 443 (1996); and D. S. K. Mudigonda et al, "Polymer Blends and Copolymers Based on N-Vinylcarbazole and N-Phenyl-2 (2'thienyl)-5-(5"-vinyl-2"-thienyl)pyrrole: A Novel Approach to Tailor Electrochromic Properties", *ACS Polymer Preprints,* 39(1), 139(1998).

On the other hand, vacuum flash evaporation followed by radiation curing technique provides high quality, pinhole-free polymer films with controllable thickness and uniformity. Therefore, it is of great interest to have a method for processing both the homogeneous solutions and the heterogeneous mixtures containing electron acceptor dopants and electron donor materials with radiation curable monomers in order to fabricate optical polymer composite films.

DISCLOSURE OF INVENTION

The present invention is directed to the fabrication of photoconductive, photorefractive, non-linear optical and optical limiting polymer composite films via vacuum deposition and radiation curing of either a homogeneous solution or a heterogeneous dispersion containing an electron acceptor dopant, an electron donor organic substance and radiation curable monomers. The doping mechanism, which is controlled on a molecular level, allows the synthesis of mechanically stable, homogeneous, thin polymer composites films with a broad range of optical, thermal and mechanical properties. The vacuum deposition process allows for control of the film thickness and composition. A combination of photoinitiators, thermal stabilizers and adhesion promoters may be mixed with the formulation prior to evaporation.

The method of the present invention may be used to form a single layer thin film polymer and comprises:

(a) mixing an electron acceptor dopant, an electron donor organic substance, and a radiation curable acrylate monomer into a homogeneous or heterogeneous mixture;

(b) atomizing the mixture in vacuum into micron size droplets;

(c) flash-evaporating the mixture at pressures and temperatures which allow the evaporation of each constituent without any degradation effect;

(d) condensing the vapor onto a temperature controlled substrate to form a thin layer; and (e) curing the thin layer with high energy radiation source (e.g., electrons, UV, IR, microwaves, ultrasonic, or gamma irradiation).

A multilayered (laminate) film polymer is formed by repeating steps (a) through (e) for same mixture until the desired number of layers is obtained. A sequential multilayered (laminate) film polymer composite is formed, using a binary evaporator system, and comprises:

(a) evaporating from a first evaporator an electron acceptor dopant at temperatures and pressures allow the evaporation without degradation effect;

(b) condensing the vapor of the dopant onto a temperature controlled substrate which is attached to a rotating drum to form a thin layer;

(c) flash-evaporating from a second evaporator a mixture of an electron donor organic substance, and a radiation curable acrylate monomer at pressures and temperatures which allow the evaporation of each constituent without any degradation effect;

(d) condensing the mixture vapor from step (c) onto the previously deposited dopant from step (b);

(e) curing the thin liquid layer with high energy radiation source (e.g., electron, UV, IR, microwaves, ultrasonic, or gamma irradiation);

(f) repeating steps (a) through (e) until the desired number of layers is obtained.

Any of the foregoing embodiments may be used to form a photoconducting polymer composite, an electrically conducting polymer composite, a non-linear optical polymer composite, or a non-linear optical polymer composite for photolimiting applications.

Other objects, features, and advantages of the present invention will become apparent upon consideration of the following detailed description.

BRIEF DESCRIPTION OF DRAWINGS

The sole FIGURE is a schematic depiction of the vacuum chamber and associated deposition apparatus.

BEST MODES FOR CARRYING OUT THE INVENTION

Reference is now made in detail to a specific embodiment of the present invention, which illustrates the best mode presently contemplated by the inventors for practicing the invention. Alternative embodiments are also briefly described as applicable.

In the practice of the present invention, a homogenous solution or heterogeneous dispersion is prepared from an electron acceptor dopant, an electron donor substance and a radiation curable monomer(s) as a crosslinking agent. The dopant may be any electrophilic organic substance that interacts or complexes with any electron-rich organic material. Other components such as polymerizable solvents, photoinitiators, or adhesion promoters may be introduced. Also, a low vapor pressure thermal stabilizer may be added to prevent undesirable premature polymerization. Referring to the sole Figure, the homogeneous solution is pumped from a storage tank 1, is atomized in vacuum into fine droplets by an atomizer 2. The droplets are then introduced into a heated evaporator 3 where they flash evaporate upon contact with the heated wall. In contrast, heterogeneous slurries are directly extruded in vacuum and evaporated. Both the homogeneous and the heterogeneous composites produce same quality polymer composite films; however, heterogeneous slurry systems have less solubility limitations and allow higher loading of reacting components. The temperature of the evaporator walls is kept above the boiling or sublimation point of the formulation and below the degradation point of each constituent. The vapor is then made to condense onto a temperature controlled substrate 4 to form a thin liquid layer which is subsequently cured by radiation which emanates from the source 5. The layer deposition sequence is repeated until the desired number of layers is reached. The whole process takes place in a vacuum chamber 6.

The electron-acceptor dopant (e.g., $C_{60}$ fullerene, tetracyanoethylene, or tetrafluoromethanecyanoquinodimethane), the electron-donor substance (e.g., vinylcarbazole, 9,10-bis (phenylethnyl) anthracene, sudan azo dyes, or polyaniline), and the radiation curable mono- and diacrylate monomer (e.g., bisphenol-A-epoxy diacrylate, tetrahydrofurfuryl acrylate, triethyleneglycol diacrylate, or phenoxyethyl acylate) mixtures can be homogeneous solutions or heterogeneous slurries, depending on the following factors: (a) the solubility parameters of each component; (b) the molar ratio of each component in the mixture; and (c) the loading amount of the electron donor and electron acceptor components in the acrylate monomer.

Three different methods have been developed for forming thin film composites from either a homogeneous solution or a heterogeneous slurry. These embodiments are described below.

The method of the first embodiment forms a single layer thin film polymer and comprises:

(a) mixing an electron acceptor dopant, an electron donor organic substance, and a radiation curable acrylate monomer into a homogeneous or heterogeneous mixture;

(b) atomizing the mixture in vacuum into micron size droplets;

(c) flash-evaporating the mixture at pressures and temperatures which allow the evaporation of each constituent without any degradation effect;

(d) condensing the vapor onto a temperature controlled substrate to form a thin layer; and (e) curing the thin layer with a high energy radiation source (e.g., electrons, ultraviolet (UV), infrared (IR), microwaves, ultrasonic, or gamma irradiation).

The method of the second embodiment forms a multilayered (laminate) film polymer and comprises:

(a) mixing an electron acceptor dopant, an electron donor organic substance, and a radiation curable acrylate monomer into a homogeneous or heterogeneous mixture;

(b) atomizing the mixture in vacuum into micron size droplets;

(c) flash-evaporating the mixture at pressures and temperatures which allow the evaporation of each constituent without any degradation effect;

(d) condensing the vapor onto a temperature controlled substrate which is attached to a rotating drum to form a thin layer;

(e) curing the thin layer with a high energy radiation source (e.g., electrons, UV, IR, microwaves, ultrasonic, or gamma irradiation); and (f) repeating steps (a) through (e) for same mixture until the desired number of layers is obtained.

The method of the third embodiment forms a sequential multilayered (laminate) film polymer composite using a binary evaporator system and comprises:

(a) evaporating from a first evaporator an electron acceptor dopant at temperatures and pressures allow the evaporation without degradation effect;

(b) condensing the vapor of the dopant onto a temperature controlled substrate which is attached to a rotating drum to form a thin layer;

(c) flash-evaporating from a second evaporator a mixture of an electron donor organic substance, and a radiation curable acrylate monomer at pressures and temperatures which allow the evaporation of each constituent without any degradation effect;

(d) condensing the mixture vapor from step (c) onto the previously deposited dopant from step (b);

(e) curing the thin liquid layer with a high energy radiation source (e.g., electrons, UV, IR, microwaves, ultrasonic, or gamma irradiation); and (f) repeating steps (a) through (e) until the desired number of layers is obtained.

Any of the foregoing embodiments may be used to form a photoconducting polymer composite, an electrically conducting polymer composite, a non-linear optical polymer composite, or a non-linear optical polymer composite for photolimiting applications.

EXAMPLES

Example 1

A Single Layer Doped Polymer Matrix

A mixture containing 0.10 g of $C_{60}$ as electron acceptor dopant, 0.40 g of 9,10-bis-(phenylethnyl) anthracene as electron donor material, 1.0 g bisphenol-A-glycerolate diacrylate as radiation-curable monomer and 0.001 g 3-tert-butyl-4-hydroxy-5-methylphenyl sulfide as low vapor pressure polymerization inhibitor with a controlled viscosity was first atomized in a vacuum chamber, and then introduced into an evaporator which was preheated to 550° C. The pressure in the vacuum chamber was maintained below $3 \times 10^{-6}$ Torr (1 Torr=1 mm Hg). The values of temperature and pressure are critical parameters for flash-evaporating $C_{60}$ with the other components. On touching the evaporator wall, the mixture was flash-evaporated onto an indium tin oxide (ITO)-coated film which contacted a cooled drum. The condensed vapor formed a thin liquid layer which was immediately cured by exposure to energetic electrons. Aluminum was then evaporated through a mask to form the second electrode (the first one being ITO). The device fabricated by this process showed excellent photocurrent response.

Example 2
A Two-Layer $C_{60}$/Polymer Film

An amount of 0.10 g of $C_{60}$, was introduced into an evaporator and heated at 550° C. The pressure in the vacuum chamber was maintained below $3 \times 10^{-6}$ Torr. The values of temperature and pressure are critical parameters for evaporating $C_{60}$ on a substrate. A mixture containing 0.40 g of 9,10-bis-(phenylethnyl) anthracene as electron donor material, 1.0 g bisphenol-A-glycerolate diacrylate as radiation curable monomer and 0.001 g 3-tert-butyl-4-hydroxy-5-methylphenyl sulfide as low vapor pressure polymerization inhibitor with a controlled viscosity was introduced into another evaporating station and heated at 200° C. On touching the evaporator wall, the mixture was flash evaporated onto the deposited $C_{60}$ film which contacted a cooled drum. The condensed vapor formed a thin liquid layer which was immediately cured by exposure to energetic electrons. Aluminum was then evaporated through a mask to form the second electrode on the top of the cured polymer film (the first one being ITO).

Example 3
A Multilayer Doped Polymer Matrix

A mixture containing 0.10 g of $C_{60}$ as electron acceptor dopant, 0.40 g of 9,10-bis(phenylethnyl) anthracene as electron donor material, 1.0 g of bisphenol-A-glycerolate diacrylate as radiation curable monomer, and 0.001 g of 3-tert-butyl-4-hydroxy-5-methylphenyl sulfide as low vapor pressure polymerization inhibitor with a controlled viscosity was (a) first atomized in a vacuum chamber and then (b) introduced into an evaporator which was preheated to 550° C. The pressure in the vacuum chamber was maintained below $3 \times 10^{-6}$ Torr. The values of temperature and pressure are critical parameters for flash evaporating $C_{60}$ with the other components. On touching the evaporator wall, the mixture was (c) flash evaporated onto an ITO coated film which contacted a rotating, temperature-controlled drum. The condensed vapor formed a thin liquid layer which was immediately (d) cured by exposure to energetic electrons. Steps (a) through (d) were repeated continuously as the drum rotated. The process was stopped when the desired number of layers (100) was reached. Aluminum was then evaporated through a mask to form the second electrode on the top of the cured polymer film (the first one being ITO).

Example 4
A Sequential Multilayer $C_{60}$/Polymer Film

An amount of 0.10 g of $C_{60}$, was introduced into an evaporator and heated at 550° C. The pressure in the vacuum chamber was maintained below $3 \times 10^{-6}$ Torr. The values of temperature and pressure are critical parameters for evaporating $C_{60}$ on a substrate. A mixture containing 0.40 g of 9,10-bis-(phenylethnyl) anthracene as electron donor material, 1.0 g bisphenol-A-glycerolate diacrylate as radiation curable monomer and 0.001 g 3-tert-butyl-4-hydroxy-5-methylphenyl sulfide as low vapor pressure polymerization inhibitor with a controlled viscosity was (a) introduced into another evaporating station and heated at 200° C. On touching the evaporator wall, (b) the mixture was flash evaporated onto the deposited $C_{60}$ film which contacted a rotating, temperature-controlled drum. The condensed vapor formed a thin liquid layer which was immediately (c) cured by exposure to energetic electrons. Steps (a) through (d) were repeated as the drum rotated. The process was stopped when the desired number of layers (100) was reached. Aluminum was then evaporated through a mask to form the second electrode on the top of the cured polymer film (the first one being ITO).

Industrial Applicability

The method for forming a thin film polymer composite from either a homogeneous solution or a heterogeneous slurry is expected to find use in the production of photonic polymer composites.

Thus, there has been disclosed a method for forming a thin film polymer composite from either a homogeneous solution or a heterogeneous slurry. It will be readily apparent to those skilled in this art that various changes and modifications of an obvious nature may be made, and all such changes and modifications are considered to fall within the scope of the present invention, as defined by the appended claims.

What is claimed is:

1. A method for forming a sequential multilayered film polymer composite via a binary evaporator system from either a homogeneous solution or a heterogeneous slurry according to the following steps:

(a) evaporating from a first evaporator an electron acceptor dopant at sufficient temperatures and pressures to allow the evaporation;

(b) condensing the vapor of the dopant onto a temperature controlled substrate which is attached to a rotating drum to form a layer;

(c) flash-evaporating from a second evaporator a mixture of an electron donor organic substance and a radiation curable acrylate monomer at sufficient pressures and temperatures which allow the evaporation of each constituent;

(d) condensing said mixture vapor (step c) onto the previously deposited dopant (step b);

(e) curing the layer with a radiation source; and (f) repeating steps (a) through (e) until a desired number of layers is obtained.

2. The method of claim 1 wherein said polymer is a photoconducting polymer composite.

3. The method claim 1 wherein said polymer is an electrically conducting polymer composite.

4. The method of claim 1 wherein said polymer is a non-linear optical polymer composite.

5. The method of claim 1 wherein said polymer is a non-linear optical polymer composite for photolimiting applications.

6. The method of claim 1 wherein said radiation is selected from the group consisting of electrons, ultraviolet, infrared, microwaves, ultrasonic, and gamma radiation.

\* \* \* \* \*